United States Patent [19]
Swanson et al.

[11] 4,078,229
[45] Mar. 7, 1978

[54] THREE DIMENSIONAL SYSTEMS

[76] Inventors: Wyn K. Swanson, P.O. Box 4321, Berkeley, Calif. 94704; Stephen D. Kremer, 5325 Lamlin Ave., Oakland, Calif. 94618

[21] Appl. No.: 544,480

[22] Filed: Jan. 27, 1975

[51] Int. Cl.$^2$ ............................................. G11C 13/02
[52] U.S. Cl. ........................... 340/173 CM; 346/160; 204/157.1 R; 365/11; 350/354
[58] Field of Search ...... 340/173 R, 173 CT, 173 CS, 340/173 CM, 173 NI; 346/74 CH, 74 P; 204/157

[56] References Cited
U.S. PATENT DOCUMENTS

| 3,119,099 | 1/1964 | Biernat | 340/173 NI |
| 3,715,734 | 2/1973 | Fajans | 340/173 CS |
| 3,820,087 | 6/1974 | Chaudhari | 340/173 CM |

Primary Examiner—Terrell W. Fears

[57] ABSTRACT

Method and media are provided for producing three-dimensional sensible objects by the intersection of radiation beams, whereby an active region is produced as a result of the intersection of said beams raising a molecule in the active region to its excited state. Particularly, non-radiation emissive active regions are formed which generate the sensible object.

15 Claims, 9 Drawing Figures

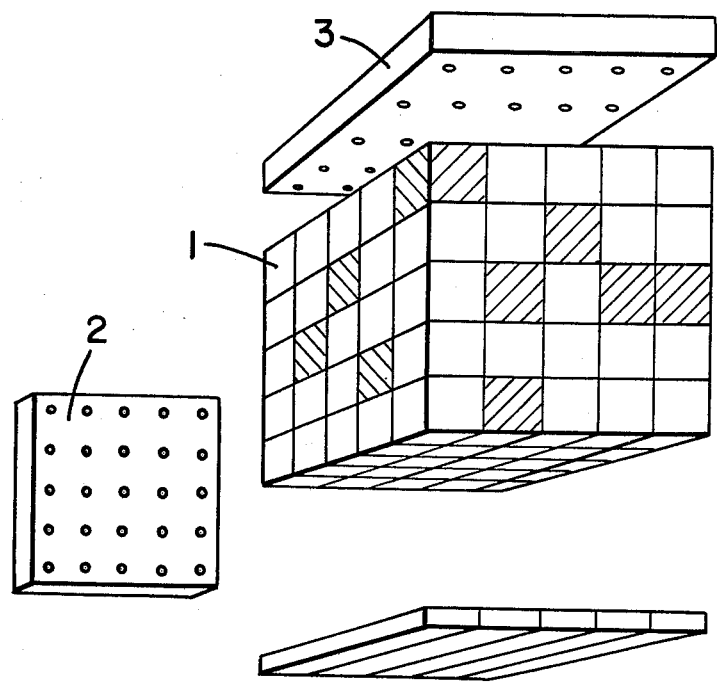
FIG_1
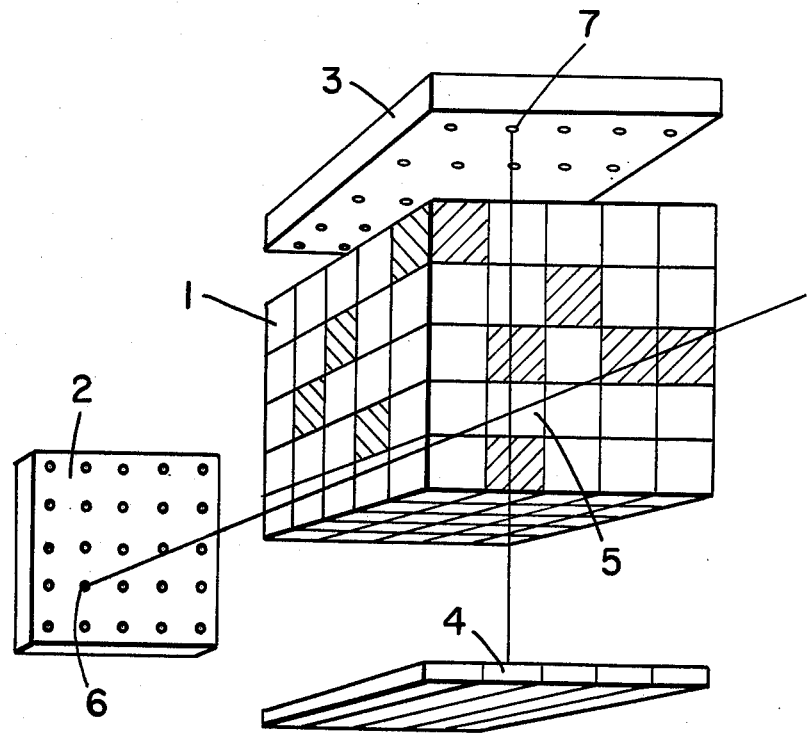
FIG_2

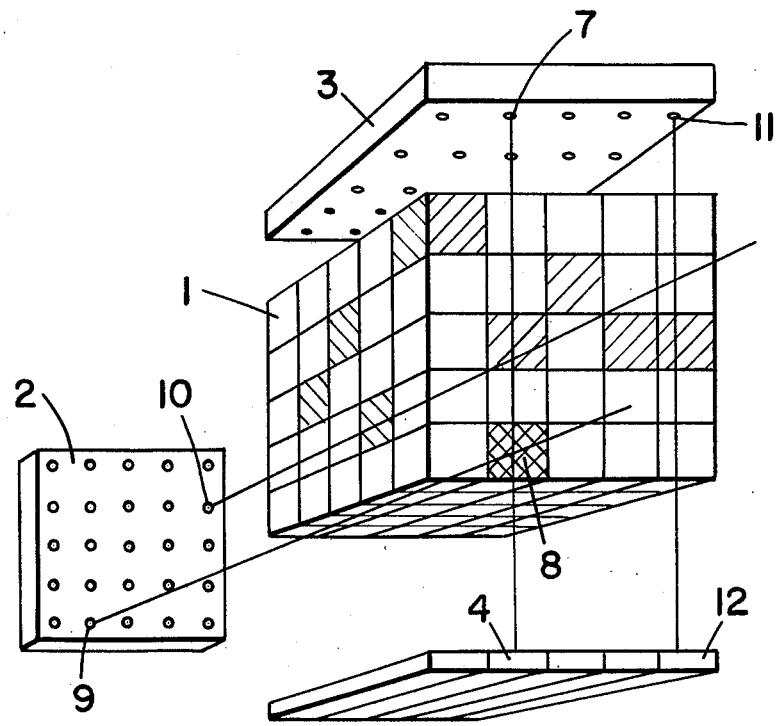
FIG_3
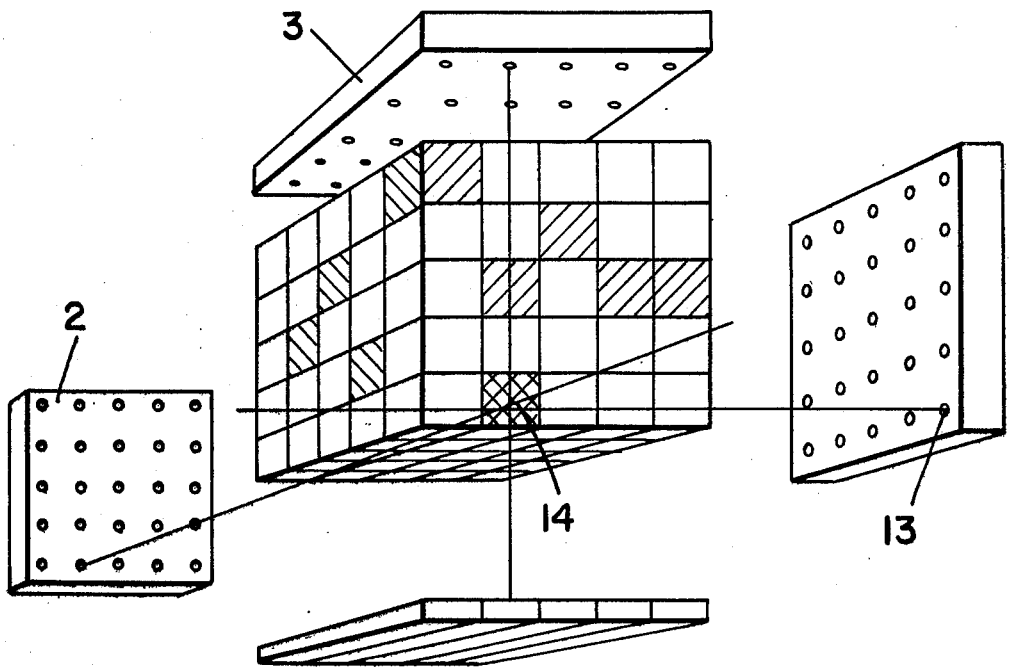
FIG_4

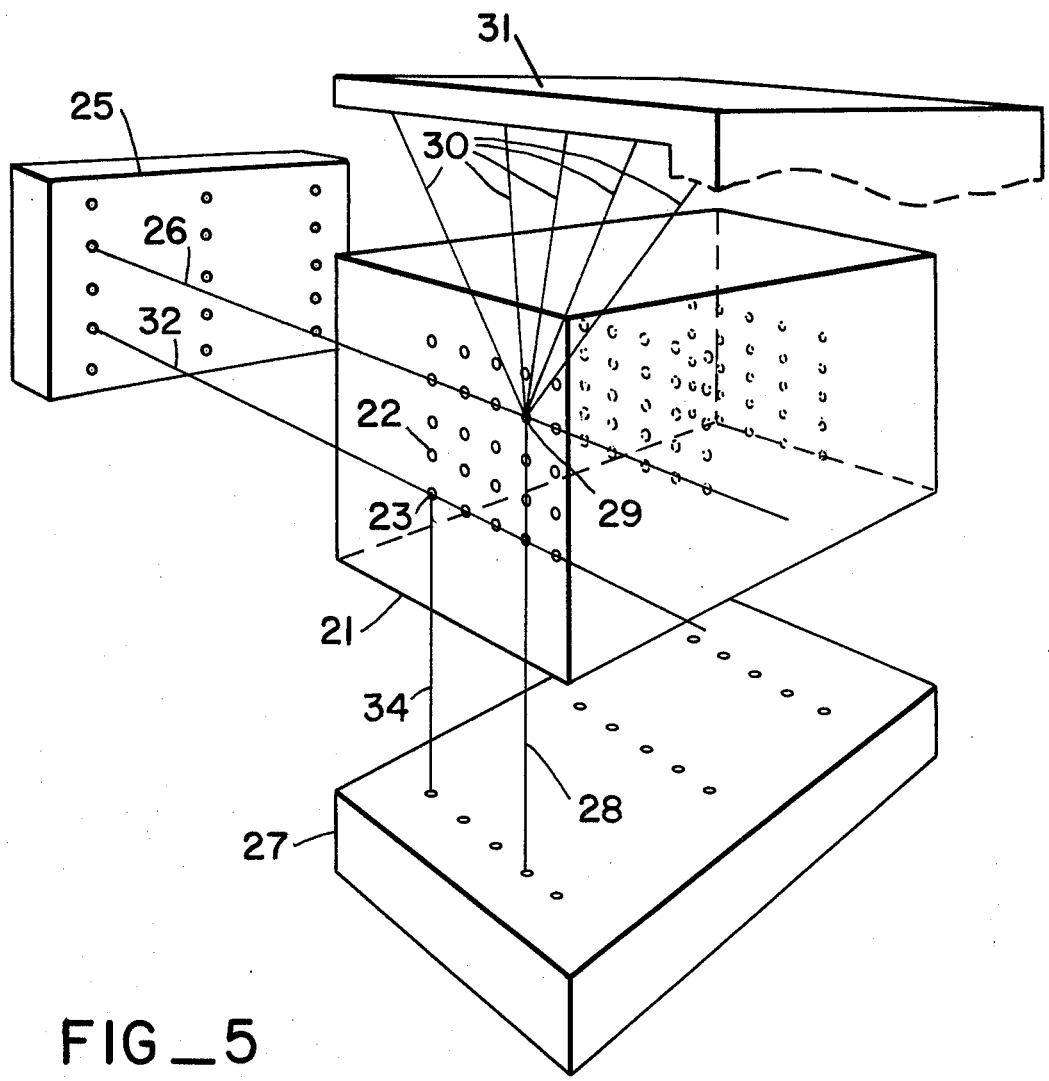
FIG_5
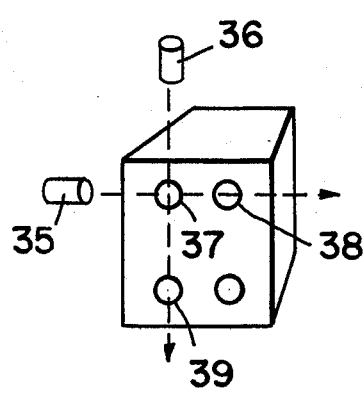
FIG_6
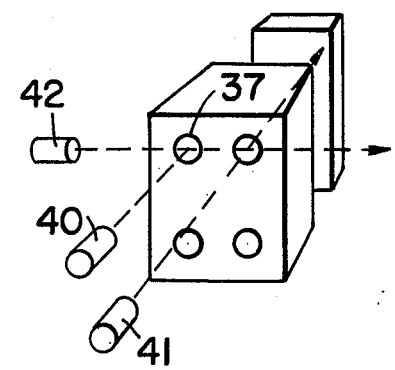
FIG_7

Unimolecular Photophysical Processes.
Solid Lines, Radiative Transitions; Broken Lines, Radiationless Transitions

THREE DIMENSIONAL SYSTEMS

The present invention is directed toward improved media for use in production of true three-dimensional sensible objects in apparatus utilising the combined effect of at least two intersecting beams of radiation to form an active region within the volume of medium, which active region is manipulated to shape the desired three-dimensional sensible object.

Known media for this purpose have been described in U.S. Pat. Nos. 3,609,706 and 3,609,707 and 4,041,476. Part of the last named application appears as British Pat. No. 1,243,043.

In general the known media may require a substantial period of time for use in the construction of extensive or elaborate shapes, sometimes there is undesirable sensitivity or residual sensitivity to one or more of the activating beams, which restricts use to construction of certain simple shapes.

It is the purpose of this invention to provide improved media in which registration of the active region within the medium is very rapid, down to the microsecond or picosecond range.

Another object is to provide media in which the attenuation of the beams in passage through the medium to the site of the active region is very much reduced and for practical purposes eliminated.

A third objective is to provide media suitable for production of large-scale sensible objects.

A fourth objective is to provide media with improved resolution capabilities.

Another objective is to provide media in which the sensible object produced comprises regions with altered refractive index forming integrated lens regions within the medium volume which may also be incorporated into three-dimensional optical circuits.

A sixth object is to provide media within which there may be produced patterns of altered condition capable of being used as the components of a three-dimensional optical computer memory in which data registration and readout of data can be accomplished by use of collimated or focussed beams.

A seventh object is to provide media within which the above mentioned memory elements may be combined with three-dimensional optical circuitry to form a computer memory matrix.

An eighth object is to provide a means by which any known photoreactive material may be employed as a two-stage photoreactive element as described in U.S. Pat. No. 4,041,476 by suitable selection of activating beams and energy levels.

Additional objects are disclosed in the following specification.

In the above mentioned U.S. Pat. No. 4,041,476 media suitable for use in the invention are grouped into two classes. These classes describe the relationship between the constructing beams and the elements of the medium which form the active region in response to the combined effect of the at least two beams. It may be noted that the two classes relate to the micro-scale of the reactive systems and are not descriptive of the manner in which the constructing beams are manipulated. Manipulation of the beams may be identical whichever class is used.

Class I systems are those in which the effect of the two beams in generating the active region occurs through their simultaneous action. For example, two components may be incorporated within the medium which are both light sensitive but to different spectral regions. By intersecting in the volume two beams of corresponding wavelength each will produce its light-product in parallel reactions and the two products simultaneously present in the given region will react to form the desired sensible object. When one or both of the products undergoes rapid reverse reaction (as is desireable in order to avoid interference effects) no sensible object will be generated where the two beams are not simultaneously present.

Class II systems differ from the former in that the medium in the first instance contains only a single reactive component which must be stimulated by a first of at least two beams (designated the primary beam), to thereby generate a second component which is sensitive to the second or secondary beam. By this sequential process Class II media provide the active region which generates the sensible object. Additive systems such as shown in Example 3 of U.S. Pat. No. 4,041,476 in which the beams are identical have characteristics common to both Class I and Class II, in that they work by the cumulative effect of both simultaneous and sequential reactions. In this case the products of reaction in the active region accumulate at a rate greater than the rate of accumulation in other regions or individual beam paths. Such systems can be successfully used with an effectively infinite number of intersecting beams produced by a lens focus or many individual beams, but they are inferior to other systems. One of the accomplishments of the present invention is to provide a means whereby two beams of identical wavelength can be used to generate a non-additive but synergistic effect providing many of the advantages of previously known systems which require use of beams with different wavelength. A similar improvement is made by the present invention for those cases where different wavelengths are used but the active region generating element has substantially equivalent absorption and reaction to the two wavelengths.

Media for use in the invention are divided into two corresponding classes. Class I media respond to the simultaneous effect of one photon from each of the constructing beams to form the active region, while Class II systems require that a photon from one of the beams act on a component of the medium before the medium will be responsive to the effect of the other beam. In this case the medium is sequentially responsive first to the primary beam and then to the secondary beam. Some of the media can be used in several modes depending on the particular parameter of the beams used. For example if the absorption spectra of the first component of the previously known Class II system is similar to the modified component after exposure to the primary photon, and the beams are of similar wavelength, then the effect will be simply additive in the region of intersection. On the other hand, if the spectra of absorption are different and different wavelength beams corresponding to the individual peak absorption regions are used, then a synergistic effect is obtained and the active region will be maximally differentiated from the rest of the medium. This is not the case, however, with the Class II systems of the present invention, in which a synergistic effect is obtained under either of the above conditions, but it will be potentially greater using different wavelengths and corresponding elements with selective absorption. Systems have been generally classified and described according to that mode of use which provides the maximum effect in the active region and a minimum of spurious effect in non-image areas.

In addition to those elements which play a direct role in generating the active region the medium will contain other material such as dispersive agents, matrix polymers, glasses, gels, liquid or gaseous components, etc. within which reactions will occur and which are transmissive of the radiations used. Examples of such other material will be found throughout the examples of the following pages.

Among the other applications to which the media of the present invention lend themselves one important use is in the construction of three-dimensional optical circuitry. For example, by using materials in which the refractive index is altered in the medium by the action of intersecting beams, one can construct actual lenses within a suitable volume of material. Also, it becomes possible to construct complex optical circuits in a similar fashion in three-dimensions. Known optical circuits are confined to plane surfaces, as described in the article by S.E. Miller. *Bell System Technical Journal*, September 1969, page 2059 or *Science*, Nov. 13, 1970, page 694. Suitable materials have been described for the purpose of making thick holograms in articles by M.R.B. Forshaw, *Optics and Laser Technology*, February 1974, page 28, and by Bowden, Chandross and Kaminow in *Polymer Engineering and Science*, July 1974, Vol. 14, No. 7, page 494. By matching the constructing beams to the properties of these materials and catalysts one can construct with two beams of different energy combining to form the active region without significant attenuation and with great speed. Use of the medium in the process of this invention converts the conventionally single stage photoresponse mechanism (reactive for example to beam A) to the two-stage mechanism described in pending application Ser. No. 165,042 (requiring the combined effect of two different beams B and C).

Other materials which exhibit refractive index changes have been described by J.A. Jenny, Journal of the Optical Society of America. Vol. 60, September, 1970, p. 1155. With two-stage media based on such compositions an independent radiation can be used to activate a stabilising component such as p-toluene sulphinic acid to prevent further change.

Most of the above mentioned compositions undergo refractive index change as a gradient through monomer-polymer-copolymer-crosslinked polymer. Alternatively photochromics such as described by Tomlinson, et.al. at Bell Telephone Laboratories (Spring meeting, 1973, Optical Society of America) are available which exhibit significant differences in refractive index with respect to wavelengths not absorbed by either phase of the photochromic.

Another improvement of the present invention over the prior art lies in the technique applied to certain media in which the shape of the intersection is controlled so that only one point or surface of the intersection region is placed so as to follow the tangent to the surface of the shape being generated, while the remaining portion of the region of intersection is kept either within or without the locus of the surface of an object to be shaped. In this way the locus of the surface can be more accurately defined (the tangent point is effectively manipulated in the same way as a conventional machine tool cutting edge), and instead of obtaining a thin shell of sensible object, the body of the "light tool" will create a substantial body of material altered by the active region. The actual shape and size will be determined by the controlled shape of the intersection and the technique is of particular value when a separate object is to be prepared.

Another important application to which the new media lend themselves is in the construction of three-dimensional optical computer memories. Such media may include optical circuit elements as described above, and may incorporate the energy transfer and photochromic dyes described elsewhere in this specification. The following description of simple examples of such volume memories is not meant to be confining, but will demonstrate basic principles of operation for such a memory.

The prior art has disclosed a variety of optical memory devices such as the article by Stephen Herman presented at the Symposium on Modern Optics, Polytechnic Institute of Brooklyn, Mar. 1967, and reprinted in *Modern Optics*. All of such devices have been two-dimensional arrays with the exception of that described by Geller in U.S. Pat. No. 3,654,626. The advantage of the present invention over two-dimensional arrays in terms of information capacity alone is obvious. Geller's memory is in three-dimensions but lacking the use of two-stage photoreactions he is confined to use of a focus beam for all functions. This is particularly disadvantageous in readout, and the presently described technique is a significant improvement.

Other advantages of a three-dimensional computer display using the present invention include provision of data density up to $10^{12}$ bits per cubic centimeter, of particular advantage for language translation, character recognition, machine control, and other uses for which a high density fixed memory is suitable. Another advantage is the provision of optical interconnection of digital elements in which signal connection between parts of the system is possible without the need for electrical or physical contacts. Further, the invention gives non-destructive read-out capable of parallel operations and in which signal isolation allows unsynchronised operation of write-erase and read modes with random access write and simultaneous associative search.

BRIEF DESCRIPTION OF DRAWINGS

FIG. 1 shows the elements of the invention.
FIGS. 2–5 show the operation of the invention.
FIGS. 6 and 7 illustrate an alternative embodiment.

DESCRIPTION OF THE DRAWINGS

Figure 8:
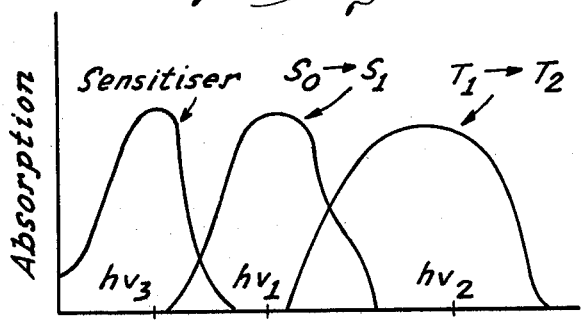
FIG. 8 is a wave form diagram useful in describing absorption charcteristics.

FIG. 1 is an embodiment of the invention composed of individually assembled 1 cm.$^3$ blocks of photochromic glass (representing + bits, for example) with non-photochromic blanks of glass ( − bits). Photochromic is used in the sense of capacity to switch between different absorptive conditions not necessarily confined to the visible region and also encompassing the capacity for altered absorption exhibited by excited state molecules as described elsewhere in this specification.

Programming this simple fixed memory is accomplished during assembly, placing a photochromic cube in positions representing a (+) bit, while blanks are used to occupy positions of (−) bits. In this drawing 1 individually addressable portions number 125 ($5^3$), which are accessable through operation of the digital light beam deflectors 2 and 3, located at the bottom and side of the memory array. At the rear of the assembly is a photodetector cell 4, used in the reading operation. Instead of a digital deflector system, individual semiconductor lasers can be used.

In operation of the device shown in drawing 1 beam source 2 will provide a wavelength beam selected to interact closely with the coloring wavelength of the photochromic element while beam source 3 will be selected to be strongly absorbed by the colored form generated in the sensitive cubes by absorption of beam 2.

Drawings 2 and 3 show the operation of the above device. In drawing 2 the cell selected for reading is marked 5, and in the process of reading it is penetrated from beam source 6 matched to the coloring wavelength of the incorporated photochromic. In this case cell 5 contains no photochromic and in consequence beam 7 penetrates without absorption and registration on photodetector 4 indicates a (−) bit. With photochromics having two stable states, the memory may be additionally subjected to appropriate heat or radiation to maintain the desired state in dominance except where overridden by beams in the reading operation. With the excited state media of the present invention such additional radiation is not needed and the rapid return to ground state allows very high reading rates.

In drawing 3 a similar operation is carried out with a (+) bit in the position of interest and the photodetector has been subdivided to permit simultaneous operation in the different corridors of information. In more sophisticated versions light guides can be constructed through regions of altered refractive index as described above. Such systems are comparable to some optical memories utilising fibre optics and provide considerable improvements over manual fabrication methods as well as much improved volume capacity.

In drawing 4 an additional directed beam 13 has been added to return the cell 14 to the non-absorptive condition following reading. Beam 13 will be controlled by a circuit preventing activation in any column which at the same time contains a cell undergoing the interrogation-reading operation.

Choice of proper light detectors is important to take full advantage of the rapid response time of the absorptive/non-absorptive elements of the memory. This may be as little as $\frac{1}{2}$ to 10 microseconds, or better. Reverse-biased p-n junction solid state detectors give near unity gain or better with the avalanche-type, but frequency response is confined to the 10–100 Mc region and areas of surface on the order of tens of mils are required. Where the GaAs tunnel diode is used in one of the transmission-impingement memories as described above, the emitting peak conveniently matches the high efficiency detection band of both the S-1 multiplier and the silicon photodetector. All three devices are capable of speeds in the nano-second range so that the limiting factor in the speed of the memory using these devices lies within the two-stage photoreactive or emissive system itself. In this respect it is important to note that the sensitivities of the electronic devices allow response to an absorption alteration far less than would be required for human perception. Internal conversions often take place in less than $10^{-8}$ second, which means that the primary process in the photoproduction of a metastable species often occurs in about a millimicrosecond ($10^{-9}$ sec.).

This last is an important factor to allow for in the design of memories and the other applications of the present invention. It controls the time available for the secondary reaction before spontaneous decay. For example, in photochromic reduction-oxidation systems in which no electron migration or stabilization can occur after excitation, the electron returns to its ground state through either luminescence or radiationless transition. Since most charge transfer transitions occur with high probability, the excited state persists for only about $10^{-8}$ seconds. Therefore the secondary process must be very fast to compete with spontaneous return. In this case the donor or acceptor component of the redox system need not be confined to independent atoms, ions, or molecules. Alkali halide color centers are such acceptor systems comprising imperfections in crystal lattice capable of functioning as electron traps.

For transmission-impingement with the GaAs tunnel diode the vacuum detector (photo-emitter) suffers from a quantum efficiency of less than 1% at 0.9 microns falling off at the rate of about 20 dB per 1000 A. However for combinations of devices lasing in regions of higher efficiency with suitable deflectors they are more satisfactory and there is the advantage of direct high-impedance coupling to the electron multiplier amplifier permitting an enormous gain-bandwidth product. These devices are also desirable in that excellent cycle times in the nanosecond range permit high bit rates.

Obtaining high quantum gain in the memory is usually important and the best developed device is the electron multiplier with the laser amplifier, modulator gain, and avalanche detector gain offering large development potential. The electron multiplier plus light diode technique offer bit rates and channel densities on the order of 100 Mc and 4 per cm.$^2$, respectively.

While the mechanically assembled fixed memory described above gives an idea of the working of the invention, the most valuable adaptations use media in which the local regions of memory store are generated in situ through the combined effect of intersecting beams. In one such version the analogue of the above transmission-impingement memory can be constructed through localised activation or poisoning of a homogenously ddistributed photochromic. For example the spyropyrans of British Pat. No. 935,186 are photochromic only in solution and can be activated by localised solution through depolymerisation in the Oster-based media of U.S. Pat. 4,041,476. Similarly behaved are the anthrones of British Pat. No. 873,380. A large number of photochromic materials are known in the literature to be inactivated by minute amounts of materials which can be photo-generated by the method of this invention.

Drawing 5 shows another type of volume memory based on media of the present invention. The matrix 21 is composed of material capable of fluorescence under appropriate stimulation. Beam sources 25 and 27 provide intersecting beams of dissimilar radiation, 26 and 28, selected according to the sensitivity of 25 and 27 to particular wavelengths. The memory has been previously programmed through poisoning of the fluorescence capacity in selected bit locations (23), while leaving this capacity in other areas intact (22,29).

Operation of this radiation-emissive memory is carried out by simultaneous or sequential stimulation of the selected bit location with beams 26 and 28 (for practical purposes the sequential stimulation will be simultaneous). Depending on the particular mechanism involved, one beam raises the electron excitation level to a first excited state from which spontaneous decay is non-radiation emitting, while the second beams acts on these excited state molecules to raise them to a subsequent excited state, from which decay produces fluorescence on return to the ground state. In this simple apparatus each such event is recorded by surrounding rounding photodetectors 31 and through synchronised timing can be read as a (+) bit in the selected cell. For more rapid operation or simultaneous multiple reading the volume will be sectioned by use of optical circuitry and light guides generated through control of refractive index as described above.

Another variation is shown in drawings 6 and 7. Here for clarity only one section of the medium is shown with only four positions or cells. This memory is programmed as in drawing 5 by the action of the intersecting beams 35 and 36, acting in combination to generate at position 37 a spot of colored fluorescent dye representing the (+) state. Position 38 will be left undyed through absence of beam 36 while position 39 will be left undyed in absence of beam 35. This memory system incorporates an auxilliary photochromic compound specifically responsive (coloring) to the fluorescence wavelength of the dye formed in the programming operation above, but insensitive to any of the other wavelengths used on the material. Use of this secondary photochromic for actual blocking/un-blocking (corresponding to +1−bits) of the reading beams 40 and 41 allows selection of the plane of interest by beam 42 and permits penetration of 40 and 41 through (+) bits in other planes.

Beam source 42 generates a beam of a wavelength strongly absorbed by the fluorescent dye present in the programmed (+) positions, but to which the medium is otherwise transparent. The fluorescent dye re-emits on a wavelength causing the incorporated photochromic to color in the (+) positions so that the new photochromic coloration is superimposed on the dye coloration. This secondary absorption is different from the fluorescent dye and is selected so as to be opaque to the identical intersecting beams 40 and 41. Drawing 6 shows the effect of a (+) state in position 37. The beam from 40 is blocked by the photochromic-induced secondary absorption. The alternative effect of a (−) bit is shown in the case of beam 41, where the absence of a fluorsecent dye results in no absorption of beam 40 and in consequence no secondary absorption of beam 41 since the photochromic remains uncolored. Absence of a (+) and presence of a (−) bit at the intersection of beams 40 and 42 is registered by the the photodetector shown in drawing 6, which registers the successful penetration of beam 42. Reprogrammable systems of this kind are obtained by replacing the fluorescent dye system with a photo-reversible dye system such as described hereinafter in this specification.

Class I Systems

The known Class I systems utilising the simultaneous absorption of two photons have been compounded with two separate photoreactive components, each of which absorbs a photo to produce a product. The two products then interact to generate the figure. To maximise the differentiation of the active region different wavelengths are used and they are matched to the peak absorption regions of the individual components. These media react as in FIG. 1;

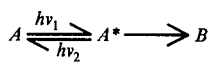

Formulas 1

-continued

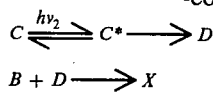

$$B + D \longrightarrow X$$

Here an original component (A) on absorbing photon $hv_1$ from beam one generates an excited state (A*), forming reaction product B. Another original component (C) on absorbing photon $hv_2$ from the second beam produces excited state (C*), resulting in product (D). Products (B) and (D) combine within the medium to form the figure element (X), which may be a dye or other effect desired.

The main disadvantage of these known systems is that in order to produce the active region multimolecular interaction takes place, necessitating the migration of elements within the medium before the active region is formed. In solid or viscous media this may be undesirably slow.

In the present invention use is made of a new kind of Class I media, in which the two photons from the individual beams are simultaneously absorbed in a single molecule so that no migration is required to generate the active region. They are diagrammed thus;

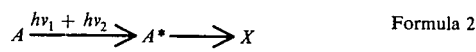

Formula 2

In these media the active region is generated when the single molecule (A) absorbs simultaneously one photon from each of the two beams ($hv_1$ and $hv_2$), producing the excited state (A*) and then (X). Once the active region has formed there may be migration of elements, for example in catalyzed reactions or other effects, but no migration is required for the generation of the active region itself.

In the following specification those older Class I systems which require migration of elements in the production of the active region are designated Class I Group 1 systems. The Class I systems of the present invention which require no migration are designated Class I Group 2 systems.

Class II Systems

Class II media are distinguished from the first class of media in that on the micro-scale the reactions forming the active region require the sequential action of photons from the two beams. In these compositions the original medium contains only one photosensitive element which when stimulated by the primary beam photon generates an intermediate product which absorbs the secondary beam, forming the active region. Most known Class II systems are also multimolecular and require migration of elements for formation of the active region. An example is No. 4 in the table of U.S. Pat. 4,041,476 in which the acid catalyst generated by the primary beam must interact with other reactants (O.R.). Since the product of this reaction is relatively stable the reactions are best diagrammed as follows;

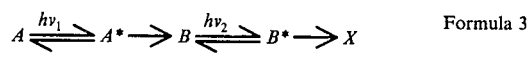

Formula 3

In this case component A absorbs the photo from the primary beam $hv_1$ to generate the excited state A*, which results in the new stable component (B). The intermediate (B) absorbs photon $hv_2$ generating the active region (in the table, No. 4 is characterised by elevated temperature and chemical change) which produces (X).

New Class II media of the above kind are dicussed in the following pages under the classification of Class II Group 2 media above. Those compositions overcome problems of migration by use of single molecule reactions, but those in which there is no rapid reverse reaction from (B) to (A) have the disadvantage that interference between beam two and the beam-path traces of beam one limit their use to certain simple figures.

Much more useful compositions of Group 2, Class II are those in which there is a reverse reaction from (B) to (A) as shown in FIG. 24. Such media have been prepared using photochromic materials and one form of use has been described in U.S. Pat. No. 4,041,476 Example 2. A different form of use is described in Table 1 of the same applicaton as numbers 20 and 21. In the latter case in order to avoid interference effects photochromics with a rapid reverse reaction from (B) to (A) will be used and it may be necessary to employ additional heat or radiation to speed that reverse reaction.

The present invention discloses a much wider range of materials with monomolecular reaction to two photons and spontaneous reverse reaction from (B) to (A) which are useful in the same mode as Table numbers 20 and 21 above. These new materials may not have the property of visible color change to the eye, but instead the change of absorption produced by the primary beam will be matched to the wavelength of the secondary beam, which may be in the nonvisible portions of the spectrum. Depending on the mode of use photochromic materials of this kind may also be classified as Class II Group 1 media, as described below.

The present invention discloses a new group of Class II media in which the reverse reaction from B to A may take place in the micro-, pico-, or nano-second range. The new materials are all monomolecular in nature and the active region is generated without the necessity for migration. These media reactions can be diagrammed thus;

Formula 4

In these systems component (A) absorbs photon $hv_1$ to generate (A*), which during its excited period has enhanced absorption of $hv_2$. Absorption of $hv_2$ produces the active region which can have a variety of characteristics. It may be raised in temperature, it may enter into a process of energy transfer, or it may result in the liberation of free radicals. Other effects which may characterise the active region are discussed in the following pages.

The following nomenclature is used.

$V_1$ is the primary beam.
$V_2$ is the Secondary beam.
$1_A$ shows a molecule in ground state ($S_0$).
$1_{A_{v/r}}$ shows a molecule in a higher vibration/rotational level of ground state manifold.
$1_A*$ shows a molecule in $S_1$ (excited singlet manifold)
$1_A**$ shows a molecule in $S_p$ (higher excited singlet manifold)
$3_A*$ shows a molecule in $T_1$ (excited triplet manifold)
$3_A**$ shows a molecule in $T_q$ (higher excited triplet manifold)

X shows radical, ion, colored product, luminescence, or other desired figure element.

The media of the present invention exploit the principles of two-photon excitation of single molecules for the production of three-dimensional sensible objects within a volume of medium by manipulation of at least two intersecting beams of radiation as set forth below.

A brief description of the physical principles involved follows. For additional information consult pages 30–31 of *Photophysics of Aromatic Molecules*, by John B. Birks, published by Wiley-Interscience, New York, 1970. Or Chapter 1 of *Organic Photochemistry*, by Robert O. Kan, McGraw-Hill, New York, 1966.

Figure 9:
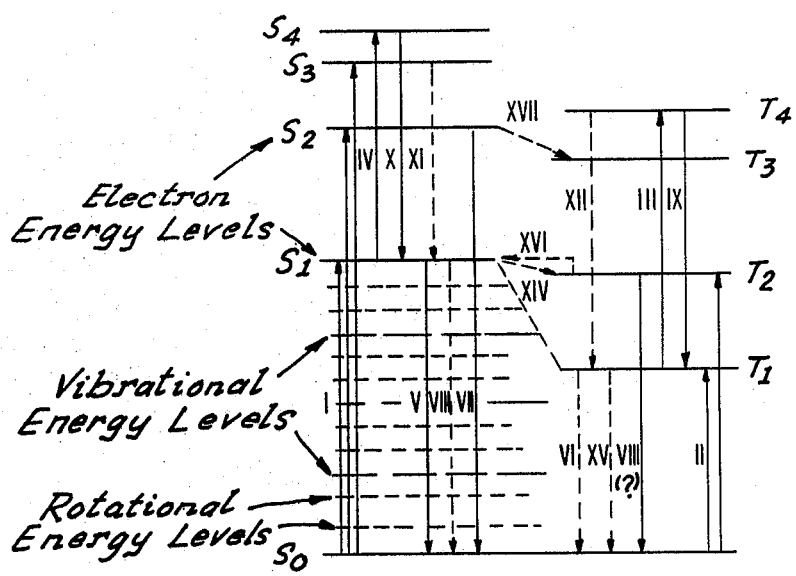
FIG. 9 is an energy level diagram.

FIG. 9 shows some of the excited intermediate states utilised in the practice of the invention. On the left side of the figure there are shown the several electron energy levels ($S_0$ or ground state), ($S_1$ or first excited state), etc. which together with associated vibrational levels ($V_1$, $V_2$ etc.) and rotational energy levels ($R_1$, $R_2$ etc.) constitute the singlet manifold. In general the higher electron energy levels ($S_1$ etc.) require the input of photon energy comparable to visible light, while the vibrational or rotational energy levels can be achieved using beams at the lower and infra-red end of the spectrum.

On the right side of FIG. 1 there is shown the triplet manifold, made up of the triplet states ($T_1$, $T_2$ etc.) with their associated vibrational levels. Movement between levels is shown with solid lines (radiative transitions) and broken lines (radiationless transitions).

In most photochemical reactions only two half-vacant orbitals are associated with a molecule in the excited state (the orbital from which the transition takes place and the antibonding orbital to which the electron in promoted), and consequently only two-values for the multiplicity are obtained: 1 and 3. The former, in which the spin has been preserved, is called the singlet state, and the latter, in which the spins are parallel, is the triplet state. Most organic molecules in the ground state are singlets. In the practice of this invention both singlet and triplet states are exploited.

Triplet state reactions are often preferred because of the advantages of their longer lifetimes. Most singlet state excitations survive only for periods measured in nanoseconds to microseconds, while triplet lifetimes are measured in microseconds to seconds. These relatively long triplet lifetimes can be selected to match with beam intensities and other factors to permit high-yield reactions, while at the same time avoiding beam interference in non-figure regions while performing rapid construction of the desired sensible objects.

In the present invention the most useful media are of Class I in which simultaneous two-photon absorption occurs and in which there is no intermediate formed, or of Class II, in which sequential two-photon excitation produces an excited state intermediate through action of the primary beam which absorbs the secondarby beam, or alternatively in which the secondary beam absorber may be in the ground state. The invention is set forth in detail in the following section.

Class I: Simultaneous Two-Photon Absorption Systems

Class I, Group 1

No new systems of this group are described here.

Class I, Group 2

Excitation from a ground state to an excited state of a molecule may occur following the simultaneous absorption of two photons. For this to occur, the energy difference between the two states designated E must be equal to or less than twice the frequency of the exciting light $x_1$ but greater than $x_1$: $x_1 < E \leq 2x_1$. One focused beam, of unfocused intersecting beams of identical frequencies can be used.

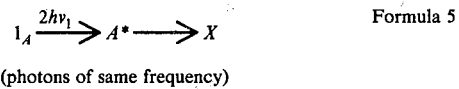

Formula 5

(photons of same frequency)

In this case although the light beams are of the same frequency, the effect at the intersection is more than simply additive. This synergistic effect is obtained because the yield of (X) is proportional to the square of the light intensity used. This synergism enlarges the usefulness of single-wavelength beams which otherwise generally require the use of many beams at one intersection, or a focus (effectively an infinite number of individual beams) to give a useful image.

Synergistic media with these advantages can be prepared according to these examples.

1. A frozen glass of 9 grams styrene in a pyrex cell is exposed to a focused, high intensity pulsed ruby laser (peak power about $3 \times 10^5$ W). After 20 pulses 31 mg. of polymer is formed. Synchronized individual beams may replace the focus beams and be moved to place the regions of generated polymer at desired locations within the volume of styrene. Other monomers such as p-isopropylstyrene or chlorine substituted styrene derivatives give greater yields of polymer and the addition of a difunctional monomer like divinylbenzene will decrease the solubility of the polymer.

2. A solution of 8'allyl-6'nitro-1,3,3-trimethylspiro-(2' N-1-benzopyran-2'-2-indoline) in benzene is exposed to intersecting synchronised pulsed ruby laser beams (4 J output free lasing mode, pulse length $3 \times 10^{-4}$ sec.) with a UV elimination filter. At the region of intersection a spot of color is formed which fades in about 10 seconds. The same experiment may be repeated using the spiropyran dissolved in a plastic (polymethylmethacrylate) in which case the time for fading of the color takes several minutes. This rate of fading can be controlled by altering the temperature. Other photochromics can be used in a similar way.

3. A transparent matrix incorporating leuco-azure A produces a red color if illuminated as above with beams of high intensity pulsed ruby laser light. Other variations are possible using materials described in the article by Oster, J. American Chemical Society, Vol. 81, p. 5100. Other color generating compounds such as photocromics of the 2.4-dinitrophenylpyridine type can be used to generate non-permanent moving display images. The speed of the color-fading reaction can be controlled with a $10^5$-fold variation by altering the pH of the system. See Journ. American Chemical Society, Vol. 84, p. 3658.

4. A viscous solution containing $10^{-2}$ M Eosin Y, $10^{-3}$ p-toluenesulphinic acid, 30% acrylamide, 5% methylenebisacrylamide in ethylene glycol is exposed to a group of high intensity intersecting beams from a ruby laser. Insoluble polymer forms as a white material at the intersection region.

Although the synergistic effect obtained with the above systems of Class I, group 2 is an improvement over the simply additive effect of earlier systems, still better effects can be obtained using at least two beams of different wavelengths, as in FIG. 6.

Formula 6

The frequencies of $(h\nu_1)$ and $(h\nu_2)$ are selected to meet the following requirements: $E \leq (h\nu_1) + (h\nu_2)$, and $(h\nu_1)$ $(h\nu_2)$, and E $2(h\nu_2)$. Under these conditions a very intense beam of wavelength $(h\nu_2)$ (in spite of high intensity the probability of three photon absorption remains very low) is intersected with a less intense beam of $(h\nu_1)$. This method gives very little two-photon absorption in the beam paths, confining photochemical reaction to the intersection alone. The excited state obtained by this method may form colored products or serve as an energy transfer agent. Where the direct effect is of luminescence, a second component can be present which reacts to the luminescence wavelength but is insensitive to the constructing beams. Thus a transitory luminescence may be used to form the non-radiation emissive sensible object of this invention.

Among other advantages of the above system are the possibility of exposure times in the microsecond or picosecond range, and the elimination of problems of special fixation for the produced object, and prevention of residual traces from the scanning beams.

Examples of Class I, group 2 two-photon absorption systems utilising different frequencies are as follows.

1. A cell filled with diphenylcyclopentadiene solution is illuminated with intersecting beams corresponding to wavelengths 9431 cm.$^{-1}$ and 18862 cm.$^{-1}$ ($h\nu_1$ and $h\nu_2$). If desired a single laser can be used to form the first path through the medium and unabsorbed emission from the far side can be passed through a KPD second harmonic generator crystal (to form $h\nu_2$) and a filter (to remove $h\nu_1$), and then be reflected back on an optical path which will cause it to reenter the medium from a new point to intersect with the original path. In this example fluorescence occurs at the intersection.

2. $Cr(CO)_6$ is dissolved in methylmethacrylate containing azoisobutyronitrile and heated at 50° C. until all polymerization is complete. Penetration of this medium by intersecting beams as above results in two-photon absorption producing an intense yellow color which is stable at 77° K., but which fades in several hours at room temperature.

3. Barium acrylate is dissolved in a hot solution of gelatin containing methylene blue, p-toluenesulphinic acid and cooled until a gel is formed. Two-photon absorption as above by the methylene blue generates radicals at the beam intersection which polymerizes the barium acrylate, yielding an opaque, light scattering polymer image.

4. A frozen glass of acrylonitrile in which is dissolved a large amount of a light activated radical generating compound such as benzoin or azoisobutyronitrile is exposed in a similar manner. Two photon absorption by the catalyst generates radicals which form light scattering insoluble polymer 5. A solution of a photo crosslinking agent such as 2-methylanthraquinone or 1-chloroanthraquinone in a suitable monomer such as vinyl acetate, styrene, methyl acrylate etc., containing a photopolymerization catalyst whose absorption spectrum is similar to the cross linking agent is frozen and exposed to two intense beams of light. At the intersection point the monomer is polymerized and crosslinked. After exposure the glass is melted and the exposed areas separated from matrix with or without the use of solvents.

6. Instead of exposing a frozen glass, gells can be used. A heat activated polymerization catalyst can be added to system 4. The solution is then heated until it gels and then exposed as above. A catalyst such as azoisobutyronitrile would be appropriate for this system since it is both heat and light activated. Solvents are used to separate the image from matrix.

7. A photosensitive polymer capable of being crosslinked by light, with or without sensitizers and additional crosslinking agents such as those in 5 is exposed to two intense beams of light such that two photon absorption occurs at the beam inteersection. The crosslinked polymer is then separated from the matrix using solvents. Examples of suitable polymers for this system: polyvinylcinnamate, polyvinylbenzophenone, polymers incorporating diethyldithiocarbamate, anthracene, azides, acylazides, sulphonyl azides, aryldiazides, a-diazoketones, furylacryl and allyl groups, stilbenes, azidocinnamates, polyacetylenes, polymers in which the light sensitive group is attached to a polymeric backbone via isocyanate compounds forming urethanes, certain alkene polymers with sensitizing halogen compounds, polyesters formed from cinnamylidenemalonic acid and related compounds. Other photosensitive polymers which crosslink via a photodimerization mechanism, or as the result of the photolysis of a photolabile group, either linked or separate from the polymer chain, can be substituted and used in a similar way.

8. Thiolated gelatine containing riboflavine or similar acting dye is exposed as in Example 6. The thiol groups at the intersection region crosslink, rendering the image insoluble.

9. A mercuric chloride crosslinked gel containing a photoreducible dye is exposed as in example 6. At the beam intersection region the mercuric ion is reduced, decrosslinking the gel. This is a negative-working system which could be used to produce a mold.

10. A clear matrix containing a high concentration of halogenated resin and if necessary other halogenated compounds, plus zinc acetate or another chemical which in the presence of halogen form a Friedel Crafts catalyst. This medium when exposed to two intense beams of appropriate frequency will generate the catalyst at the beam intersection to cause polymer degradation and colored compounds. These images can be intensified using heat.

11. The above examples 1 to 4 on pages 12–14 may also be exposed using two intersecting beams of appropriate frequency and intensity, giving results superior to that which is obtained when two-photons of the same frequency are used.

The systems of Class I, Group 2 are also susceptible to the utilization of sensitised reactions as illustrated in the following figures.

$$1_B \xrightarrow{h\nu_1 + h\nu_2} 1_B^*$$

$$1_B^* + 1_C \longrightarrow 1_C^* + 1_B$$

$$1_C^* \longrightarrow X$$

Formulas 7

FIG. 7 shows absorption of two dissimilar photons by a sensitiser utilising the singlet-singlet interaction or fluorescence. The following FIGS. 8 and 9 show singlet and triplet sensitised reactions.

$$1_B \xrightarrow{h\nu_1 + h\nu_2} 1_B^*$$

$$1_B^* + 1_C \longrightarrow 1_C^* + 1_B$$

$$1_C^* \xrightarrow{\text{intersystem crossing}} 3_C^* \longrightarrow X$$

Formulas 8

$$1_R \xrightarrow{h\nu_1 - h\nu_2} 1_R^* \xrightarrow{\text{intersystem crossing}} 3_R^*$$

$$3_R^* + 1_C \longrightarrow 1_R + 3_C^*$$

$$3_C^* \longrightarrow X$$

Formulas 9

In the above systems and those to follow the product (X) corresponds to generation of the active region or the sensible object portion. In a variation of the method which constitutes an important part of this invention and is applicable to both Class I and II systems, (X) may be an energy transfer agent such as a stable fluorescent compound which can receive energy in the form of blanket radiation. This temporary fluorescence serves as a step intermediate for the production of the sensible object of the invention. The advantage of this is that a single fluorescent molecule is capable of transferring more than a thousand photons per second to an acceptor system. Thus, the original effect of the photon or photons used to generate (X) during the scanning process can be amplified greatly, permitting a low concentration of (X) while at the same time giving a satisfactory sensible object. This is particularly advantageous when (X) is obtained through inefficient two-photon absorption processes. This is diagrammed as in the following figure. Here (L) is a receptor system.

$$1_X \xrightarrow{h\nu_3} X^*$$

$$X^* + L \longrightarrow X + L^*$$

$$L^* \longrightarrow \text{sensible object element}$$

Formulas 10

Examples of such sensitising and amplification systems are the following.

1. A dye precursor in a clear matrix is exposed to two intersecting beams of light of appropriate frequency and intensity such that two photon absorption occurs at the beam intersection, resulting in dye formation. This dye has the ability to photosensitise (T - T energy transfer) the decomposition of the dye precursor via one-photon reaction resulting from absorption of the long wavelength scanning beams or of a separate developing beam. This is shown in FIG. 11:

$$A \xrightarrow{h\nu_1 - h\nu_2} A^* \longrightarrow B$$

$$B \xrightarrow{h\nu_3} B^*$$

$$B^* + A \longrightarrow A^* + B$$

$$A^* \longrightarrow B \text{ (here } A \text{ is the dye precursor and } B \text{ is the dye)}$$

Formulas 11

One such system can be prepared in a transparent matrix containing amines such as diphenylamine or N-vinylcarbazole together with an organic halide such as iodoform or carbon tetrabromide. The halide and amine will combine to form a complex which when exposed to the intense pulse of a ruby laser beam intersection forms a small quantity of dye. The amount of dye in the image region can be increased or developed out using red light.

2. Stable fluorescers can also be generated via simultaneous two-photon absorption systems using the fluorescer precursers listed on pages 389-410, volume 33 of the Journal of pure and Applied Chemistry. Many light activated generating reactions are available, such as oxidative cyclization, dedimerization, tautomerization, rearrangement, elimination, oxidation, addition, substitution, reduction, etc.

In another variation of the above, the final product (X) may be a photocatalyst. A photocatalyst is distinguished from an energy transfer agent by the fact that it is consumed in the subsequent figure formation reactions. These are diagrammed thus, and examples follow the figure.

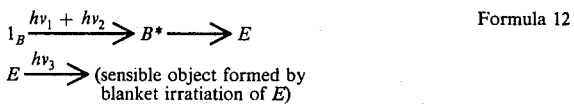

Formula 12

1. A compound (A) which can generate a polymerization catalyst (B) via a photoreaction is dissolved in a suitable monomer or crosslinkable polymer. Two photon absorption using intersecting beams is used to generate the active photocatalyst (B) in the desired configuration. The matrix is then exposed to some form of radiation which activates the catalyst (B), but not (A). Compound (A) may also be a polymerization catalyst which has been chemically altered or complexed such that the inactivation can be reversed via two-photon absorption and the original properties restored.

3. This operation is also suitable using certain dyes which are capable of initiating polymerization only when they are bound to macromolecular substrates. A gel containing crystal violet leuconitrile, monomer, difunctional monomer, a mild reducing agent, and polymethylacrylic acid is exposed as in example 4, above. The dye cation generated by two-photon absorption binds to the polymer. The gel is then blanket exposed to radiation in the absorption band of the dye which becomes reduced, generating radicals to polymerize the monomer. In this way the inefficiency of the two-photon absorption process is overcome using the light "development" of the weak image. This amplification effect has an additional advantage where the intersection region is unfocussed or where the beams are spread into more diffuse geometry than narrow pencil beams. For example, where three planes of light are used in generating the active region, defining by their intersection a single point comprising an active region contingent on the presence of all three planar beams. Such a system makes possible a simplification of the beam control devices, although other parts of the system become more complex.

Class II Systems: Sequential Absorption Systems.

The new Class II systems of this invention are divided into two groups. In Group 1, the secondary beam is absorbed by a molecule in an excited state produced by the previous absorption of the primary beam. In Group 2, the molecule absorbing the secondary photon will have returned after excitation by the primary beam to a new ground state different from the first ground state.

Class II, Group 1

In the following systems the primary beam acts to convert a molecule to an excited state which is capable of further absorption of radiation of the secondary beam. The molecule unexcited by the primary beam remains unabsorptive of the secondary beam radiation. Once reaching the higher excited state, the molecule may rearrange, dissociate, form a radical, transfer its energy to an acceptor system, or otherwise react. In the absence of the secondary beam the excited molecule will not follow any of these paths, but simply decay back to the ground state from which it had been aroused by the primary beam, eliminating any beam path traces.

Unlike the previously disclosed materials in which molecular migration is required, or the photochromic media in which heat or light may be required to produce rapid reversal, the present monomolecular materials have the advantage that they are less effected by the ambient conditions and, since they are monomolecular receptors, they are freely used in highly viscous or solid media. Another advantage is that they can be selected to have a reversal rate matched to the intensity of the generating beams and the speed of operation. Another important advantage is provided by the increased range of effects characterising the active region. The known media depend on heat formation in the active region to generate the sensible object as shown in table numbers 20 and 21 of U.S. Pat. No. 4,014,476. The new media of the present invention provide free radicals, direct energy transfer, and other means which greatly improve the resolution and workability of the media.

The higher excited state or its precursors may be a higher vibrational, rotational and/or electronic state. The transition from precursor to the desired excited state must take place before vibrational or electronic relaxation or transfer of excitation energy to surrounding molecules can occur. In some cases this will require the use of high intensity or pulsed laser sources.

There are three fundamental types of reaction falling under the classification of Class II Group 1 sequential two-photon excited state intermediate reactions.

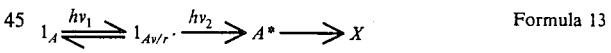

Formula 13

In the above mechanism the energy requirement to reach the state $1_{A_{v/r}}$ is relatively low, and as a result it is practical to use a wavelength in the lower or infrared energy region for $(hv_1)$. One example of this process is obtained by irradiating gaseous HCl with a primary beam at wavelength 11900 A to raise the HCl molecules along the beam path to the third vibrational level. Intersecting this path with a secondary beam at 2650 A produces luminescence. The secondary beam raises the molecules to the required higher energy level only in the intersection region because it is absorbed only there . . . molecules not previously raised to the intermediate level by the infrared radiation of the primary beam will not absorb the selected frequency radiation of the secondary beam. More examples of this type of effect which can be adapted to use in this invention are found in the article by V.S. Letokhov. "Use of Lasers to Control Selective Chemical Reactions," *Science*, Vol. 180, 1973, pp. 451-458.

The second type of sequential two-photon excited state intermediate reaction type is diagrammed thus:

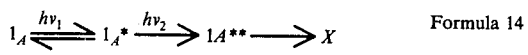

Formula 14

An example of such a reaction sequence occurs when an azulene solution is illuminated with a primary beam of wavelength 5300A and a secondary beam of wavelength 10600 A. The primary beam raises the azulene molecules along its path to an excited vibrational level of the lowest singlet $S_1$. If not further stimulated these molecules return to the ground state without fluorescing. At the intersection region, where the two beams act sequentially, the molecules in the $S_1$ excited state are raised to the $S_2$ state by the secondary beam, and then fluorescence emission occurs.

The third basic sequential two-photon excited state intermediate reaction is:

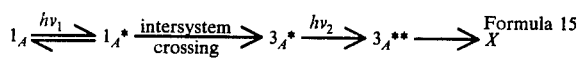

Formula 15

In this case a molecule capable of absorbing energy of appropriate wavelength forms an excited singlet which then undergoes intersystem crossing to form the triplet state. These triplets are incapable of forming radicals or undergoing figure-producing reactions and soon decay into the ground state if they are not further stimulated. However, if they are exposed to radiation of appropriate frequency they are capable of forming excited triplets which are highly reactive and capable of the various desired reactions. In using this system the primary beam generates triplets along its path and the secondary beam raises the triplets to excited triplets at the intersection. The use of sensitisers can reduce the formation of spurious excited triplets in the primary beam path. This could occur when there is overlap between the ground state-singlet and triplet-triplet absorption bands. The sensitiser absorbs the primary beam and generates the desired triplet via triplet-triplet energy transfer. By using a sensitiser and a primary beam of $hv_3$, excited triplet formation will be better localised in the intersection region as shown in FIG. 8:

Using sensitisers can also reduce primary beam attenuation since they can be used in low concentrations. They may also be used to increase the yield of triplets. Examples of these systems are as follows.

1. Tetramethylphenylenediamine in an EPA matrix at 77° K when exposed to two intersecting beams of wavelengths 3400 and 4000 A forms the TMPD radical cation at the beam path intersection, which has a blue color. This reaction will also occur in other solvents such as methyl alcohol and propylene carbonate. The radical cation may be used in visual display or to catalyse polymerization. Other similar systems can be prepared using triphenylene, 3,4-benzopyrene, diphenyl or other aromatics in boric acid glass.

2. Beta-naphthol exposed in a polymethylmethacrylate matrix to two beams matched to the singlet band and to the triplet band of absorption will form a semi-stable yellow radical at the beam path intersection.

3. Naphthalene dissolved in a solution of monomer, difunctional monomer (to effect crosslinking), and ethyl iodide is exposed to two beams of light, 3130 A and to a beam of visible light of wavelength absorbed by the triplet of naphthalene. The resulting excited triplet generates radicals which directly or indirectly polymerize and crosslink the monomer. Other compounds which can be used in place of naphthalene to generate similar radicals are acridan. 9-phenylacridan, toluene, naphthol, acriflavine, and acridine.

4. Orotic acid and similar compounds also form excited triplets via the biphotonic process. This triplet can abstract hydrogen atoms from suitable donors forming a radical which is a potent polymerization and possible crosslinking catalyst.

5. Benzoyl and oxalyl chloride and benzophenone dissolved in a polymer form an excited state which renders the polymer crosslinked and insoluble via a similar biphotonic mechanism.

As mentioned previously, media utilising sequential two-photon excited state intermediates can often advantageously incorporate sensitisers. In one group of such sensitised reactions the sensitiser absorbs the primary beam, and the energy is transferred to a ground state molecule as shown in these figures:

Formulas 16

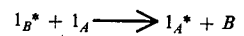

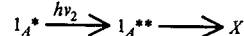

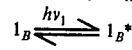

Formulas 17

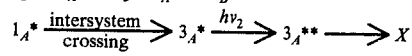

In both of the above systems sensitization is by singlet-singlet interaction or absorption of fluorescence emission. Although there is little theoretical knowledge of the details of these energy transfer mechanisms, for the present purposes practical experience has shown that it is only necessary that the emission spectrum of the donor and the absorption spectrum of the acceptor overlap. The light used need only be of the wavelength absorbed by the sensitiser; the acceptor can be entirely transparent.

FIG. 19 shows triplet-triplet sensitization, where, as above, energy is transferred to a ground state molecule.

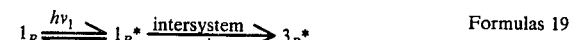

Formulas 19

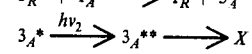

An example following the mechanism of FIG. 19 can be prepared by adding benzophenone sensitiser to the system described in example 3, above, then changing the wavelength of the primary beam to 3650 A, a wavelength which is not absorbed by the naphthalene alone.

In the following systems (FIGS. 21 and 22) the secondary beam is absorbed by the sensitiser and energy transferred to the product of the primary beam. In FIG. 21 the sensitiser transfers its energy to the excited singlet, while in FIG. 22 the energy is transferred to an excited triplet.

Formulas 20

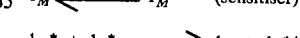

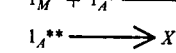

-continued

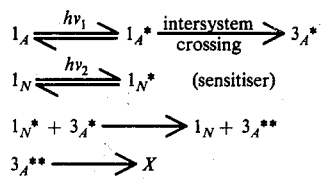

Formulas 21

Class II, Group 2

In the above described new Class II Group 1 systems, the secondary beam absorption was by a molecule in an excited state, and a distinction was made between singlet and triplet excited states. In the present Group 2 systems, because the secondary beam absorber is in the ground state, this distinction is not important and in the following section an intermediate in the excited state may be either a singlet or a triplet.

Group 2 ground state intermediate systems can be prepared in which one or both of the reactions is irreversible. For example:

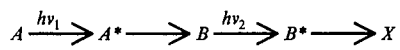

Formulas 22

An example of such a reaction is undergone by a trimethine cyanine dye which under $(hv_1)$ produces a mono cis isomer sensitive to $(hv_2)$, giving a colored di cis isomer. In a similar system rose bengal is incorporated and converted to a de-iodinated derivative by $(hv_1)$, which in turn is converted to fluorescein by action of $(hv_2)$, providing a colored fluorescent compound and polymerization catalyst. However these non-reversible systems are useful only for a limited group of simple figures.

A much more useful reversible sequential two-photon reaction using the ground state intermediate is shown in Formula 23.

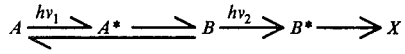

In this case absorption of the $(hv_1)$ photon by component (A) causes the transformation to component (B). Absorption of the secondary photon $(hv_2)$ by B will generate a radical or colored compound or energy transfer agent, etc., as described earlier. In those regions not effected by $(hv_2)$ compound B will decay back to A. This decay can be accomplished by absorption of light or heat energy, and it can be accelerated by suitable irradiation if the desired reversal rate and population yield are not obtained with simple ambient heat and light. Examples of such systems are the following.

1. O-methyl and o-benzophenones which reversibly photoenolize upon absorption of ultraviolet light are suitable materials. These enols upon being irradiated with a blue $(hv_2)$ react to form semi-stable cyclic compounds with yellow color.

2. Similar reactions can be obtained using 2-benzhydryl-3-benzoylchromone and its analogues. Also the dihydrobenzofurans can be utilised by exploiting photochemical ring opening in combination with photocyclization.

3. Another such system utilises isoxazole which converts to to azirine with $(hv_1)$, is reconverted to isoxazole by $(hv_2)$, and by irradiation with $(hv_3)$ yields oxazole from the intermediate azirine.

4. Another reversible group 2 system can be prepared using C-nitroso compounds which form stable dimers in aqueous and organic solvents. These dimers can be dissociated to monomers using either heat or ultraviolet light as shown in Formula 24.

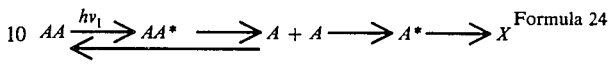

Formula 24

In this system the lifetime of the monomer is dependent on the particular nitroso compound and the choice of solvent and temperature. The monomer as opposed to the dimer has an absorption band in the visible red. Light absorbed by this band photolyzes the monomer, producing radicals. Certain dinitroso compounds such as 1,4-dichloro-1,4-dinitroso-cyclohexane can be used in a similar way.

In variations of the method, colored compounds can be obtained if the radicals are trapped by color-forming compounds added to the medium, and sensitisers can be employed as has been described for group 1 mechanisms.

5. Another variation of the mechanism shown in FIG. 24 is the following:

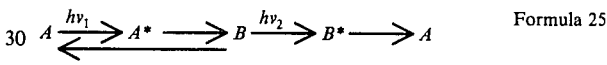

Formula 25

In this case the product from A with $(hv_1)$ is converted back by $(hv_2)$ to A. This corresponds to example 2 in U.S. Pat. No. 4,041,476, and applies generally to photochromics in which the spontaneous decay reaction of B to A is slower than the reversion of B to A in selected regions under $(hv_2)$. Other suitable photochromics include 6,6'-diethoxythioindigo dyes and derivatives, which can be optically switched between the cis and trans states using two wavelengths $hv_1$ and $hv_2$. The two isomers have different colors and properties, including the fact that only the trans isomer fluoresces. An advantage of these materials is a greatly increased quantum yield at high temperatures (90° in some epoxy resins) which provides for stability at lower temperatures after forming an image at a higher temperature.

6. Also suitable for this operation are the epoxides described in U.S. Pat. No. 3,329,502. These compounds are thermally stable and can be switched between colorless or light yellow to red.

7. Similarly N,N'-diacetylindigo dissolved in xylene and molten polyvinyl acetate after cooling gives a very stiff polymer solution which on exposure to blue (4580 A) turns to the magenta-colored trans configuration. Figures can be constructed with another beam of 5700 A using the technique of U.S. Pat. No. 3,609,707. The reverse change (an orange figure) can also be prepared using the radiations in reverse order.

What we claim is:

1. A medium for forming a substantially persistent three-dimensional sensible object comprising:
    a substantially transparent dispersion fluid capable of maintaining a relatively stable shape containable within a volume; and
    a photo-reactant substantially dispersed in said dispersion fluid, a molecule of said photo-reactant being responsive to a first photon of optical radiation emitted in a first selected spectral region to excite an electron to an excited state, said molecule being further responsive to a second photon of optical radiation emitted in a second selected spectral region to generate a mono-molecular chemical reaction at a single reaction site for rapidly forming said sensible object without migration of molecular reactants.

2. A medium according to claim 1 wherein said photoreactant molecule is responsive to the simultaneous confluence and absorption of said first photon and said second photon to generate said mono-molecular reaction.

3. A medium according to claim 2 wherein said first and second photons are provided in different spectral absorption regions of said photo-reactants.

4. A medium according to claim 1 wherein said photoreactant molecule is responsive only to the sequential absorption of said first photon and said second photon to generate said mono-molecular reaction.

5. A medium according to claim 4 wherein said photoreactant molecule is responsive only to the sequential absorption of said first photon and said second photon within the same spectral absorption region of said photo-reactant to generate said monomolecular reaction.

6. A medium as in claim 1, in which said sensible object comprises an optical computer memory arrayed in three dimensions and operated by means of intersecting light beams.

7. A medium as in claim 1, in which said sensible object is an intermediate energy transfer agent capable of responding to additional radiation so as to activate at least one further component of said medium so as to produce an additional product stage.

8. A medium for forming a substantially persistent three-dimensional sensible object substantially opaque to optical radiation within a selected spectral region comprising:
a substantially optically transparent, morphically stable dispersion fluid containable within a volume; and
a photo-reactant substantially dispersed in said dispersion fluid, substantially each molecule of which photoreactant being responsive to the simultaneous confluence of photons of at least two beams of optical radiation of substantially identical wavelength, and wherein said wavelength is matched to the spectral region of maximum optical absorption to generate a mono-molecular reaction characterized by an excited molecular state at a single reaction site such that the energy difference between said excited state and a ground state is greater than the energy of the excitation photon but less than twice the energy of said excitation photon for rapidly forming said sensible object without migration of reactants.

9. A medium according to claim 8 wherein the fluid comprises ethylene glycol and the photo-reactant comprises a homogeneous mixture of Eosin Y, p-toluenesulphinic acid, acrylamide, and methylene bisacrylamide.

10. A medium for forming a substantially persistent three-dimensional sensible object substantially opaque to optical radiation within a selected spectral region comprising:
a substantially transparent morphically stable dispersion fluid containable within the volume; and
a photo-reactant substantially dispersed in said fluid, substantially each molecule of said photo-reactant being responsive to the simultaneous effect of at least two optical beams of different wavelengths and matched to a characteristic spectral absorption region of said photo-reactant such that the wavelength of a first optical beam ($hv_1$) and the second optical beam ($hv_2$) and the energy difference (E) between a selected excited state and a ground state satisfy the following criteria:

$E \leq (hv_1) + (hv_2)$ $(hv_1) > (hv_2)$ ; and $E > 2(hv_2)$ ;

in order to generate a mono-molecular reaction at a single reaction site for rapidly forming said sensible object without migration of reactants.

11. A medium according to claim 10 wherein said photoreactant is diphenylcyclopentadiene in solution and said first optical beam is centered at a wavelength of 9431 cm$^{-1}$ and said second optical beam is centered at a wavelength of 18862 cm$^{-1}$.

12. A medium according to claim 10 wherein said fluid is methyl methacrylate contaning azoisobutyronitrile, and wherein said photo-reactant is chromium carbonyl.

13. A medium according to claim 10 wherein said photo-reactant is a gelled solution of methylene blue, p-toluene-sulphinic acid and barium acrylate and said fluid is a gelatine, wherein said medium produces a white light scattering visibly sensible polymeric object.

14. A medium according to claim 10 in which said photo-reactant is acrylonitrile in which is dissolved a light activated radical-generating compound, and wherein said fluid is a frozen glass thereof, such that the sensible object producible is a visible light-scattering figure substantially opaque to visible light.

15. A medium according to claim 10, wherein the photoreactant is a photo-cross-linking agent selected to absorb said first optical beam and a photopolymerization agent selected to absorb said second optical beam, both being dissolved in a monomeric suspension, and where said suspension is selected from the monomeric group consisting of vinyl acetate, styrene, methyl acrylate, such that said sensible object so produced resists destruction during separation of chemically reacted portions of said medium for chemically non-reacted portions.

* * * * *

UNITED STATES PATENT AND TRADEMARK OFFICE
CERTIFICATE OF CORRECTION

PATENT NO. : 4,078,229
DATED : March 7, 1978
INVENTOR(S) : WYN K. SWAINSON et al.

It is certified that error appears in the above—identified patent and that said Letters Patent is hereby corrected as shown below:

-- [76] Inventors: Wyn K. Swainson
P.O. Box 4321
Berkeley, California 94704

Stephen D. Kramer
P.O. Box 2944
Oakland, California 94618

Signed and Sealed this

Twelfth Day of August 1980

[SEAL]

Attest:

SIDNEY A. DIAMOND

Attesting Officer

Commissioner of Patents and Trademarks